United States Patent [19]

Fujino et al.

[11] Patent Number: 4,836,176

[45] Date of Patent: Jun. 6, 1989

[54] IGNITION APPARATUS OF ELECTRONIC DISTRIBUTION TYPE FOR MULTI-CYLINDER INTERNAL COMBUSTION ENGINE

[75] Inventors: Yasunori Fujino, Hiroshima; Noboru Sugiura, Mito; Ryoichi Kobayashi, Ibaraki, all of Japan

[73] Assignee: Hitachi, Ltd., Tokyo, Japan

[21] Appl. No.: 147,284

[22] Filed: Jan. 22, 1988

[30] Foreign Application Priority Data

Feb. 23, 1987 [JP] Japan .................................. 62-37982

[51] Int. Cl.$^4$ ............................. F02P 5/15; F02P 1/00
[52] U.S. Cl. .................................... 123/640; 123/644; 123/622
[58] Field of Search ............... 123/640, 630, 647, 637, 123/594, 618, 622, 644, 621, 643

[56] References Cited

U.S. PATENT DOCUMENTS

| 3,534,717 | 10/1970 | Froede | 123/640 |
| 3,794,008 | 2/1974 | Mathews | 123/640 |
| 3,828,752 | 8/1974 | Hioki et al. | 123/640 |
| 3,964,454 | 6/1976 | Nishimiya | 123/640 |
| 4,369,758 | 1/1983 | Endo | 123/640 |
| 4,397,291 | 8/1983 | Johnson | 123/640 |
| 4,711,227 | 12/1987 | Li et al. | 123/630 |

Primary Examiner—R. A. Nelli
Attorney, Agent, or Firm—Antonelli, Terry & Wands

[57] ABSTRACT

An ignition apparatus of electronic distribution type for a multi-cylinder internal combustion engine, comprising a plurality of ignition circuits each having an ignition coil and a power switching element for one or two cylinders of a multi-cylinder internal combustion engine is disclosed in which the ignition circuits are arranged into a plurality of ignition systems each having at least two of the ignition circuits and a signal current-limiting circuit is provided for each of the ignition systems to control the currents flowing through the power switching elements of the associated ignition circuits.

5 Claims, 5 Drawing Sheets

IGNITION APPARATUS OF ELECTRONIC DISTRIBUTION TYPE FOR MULTI-CYLINDER INTERNAL COMBUSTION ENGINE

BACKGROUND OF THE INVENTION

1. Field of the Invention

The present invention relates to an ignition apparatus for an internal combustion engine, or more in particular to an ignition apparatus of electronic distribution type for a multi-cylinder internal combustion engine.

2. Description of the Prior Art

A conventional ignition apparatus for an internal combustion engine is disclosed in JP-A-60-209667, in which a negative feedback circuit including current-detecting means is used to control the current in a switching device for controlling the interruption of the primary current of an ignition coil. In applying this type of ignition apparatus to a multi-cylinder internal combustion engine, it is recommended that a part of the apparatus be used in common in order to avoid multiplication of equipment and the resulting increased cost. Specifically, a conventional ignition apparatus for a double-cylinder internal combustion engine uses a current-detecting resistor and a feedback circuit, or the like for controlling the current of a pair of switching transistors.

Further, JP-A-60-209668 discloses an ignition apparatus for an internal combustion engine having four or eight cylinders, comprising four power transistors for controlling the primary current of the ignition coil, in which the four power transistors are provided with a common current detection circuit and a common feedback circuit.

In the above-mentioned prior art apparatus, however, the fact that a single current detection resistor and a single feedback circuit are shared among all switching devices makes it impossible to control all the switching devices if a given switching device is damaged due to a shorting or the like, thereby stopping the ignition of all the cylinders, thus stopping the engine.

SUMMARY OF THE INVENTION

Accordingly, it is the object of the present invention to provide an ignition apparatus of electronic distribution type for a multi-cylinder internal combustion engine having so superior a failsafe function that the damage by shorting of one switch does not result in all the other switching devices losing their functions.

According to the present invention, there is provided an ignition apparatus of electronic distribution type for a multi-cylinder internal combustion engine, comprising an ignition circuit having an ignition coil and a power transistor for each one or two cylinders of a multi-cylinder internal combustion engine, wherein the ignition circuit is integrated into a plurality of ignition systems each having at least two ignition circuit units, each of the ignition systems including a common and single current control circuit for controlling the current flowing in the power switching device of the particular ignition system.

According to another aspect of the present invention, there is provided an ignition apparatus of electronic distribution type for a multi-cylinder internal combustion engine, configured as described above and high in failsafe performance, in which if one of the power switching devices is damaged by shorting, only the ignition system associated with the damaged power switching device loses its function, while the other ignition systems hold the function thereof, with the result that the ignition of all the cylinders of the internal combustion engine is not stopped, thereby preventing the engine from stopping.

DESCRIPTION OF THE PREFERRED EMBODIMENTS

An embodiment of the present invention will be described below with reference to the accompanying drawings.

Figure 1:
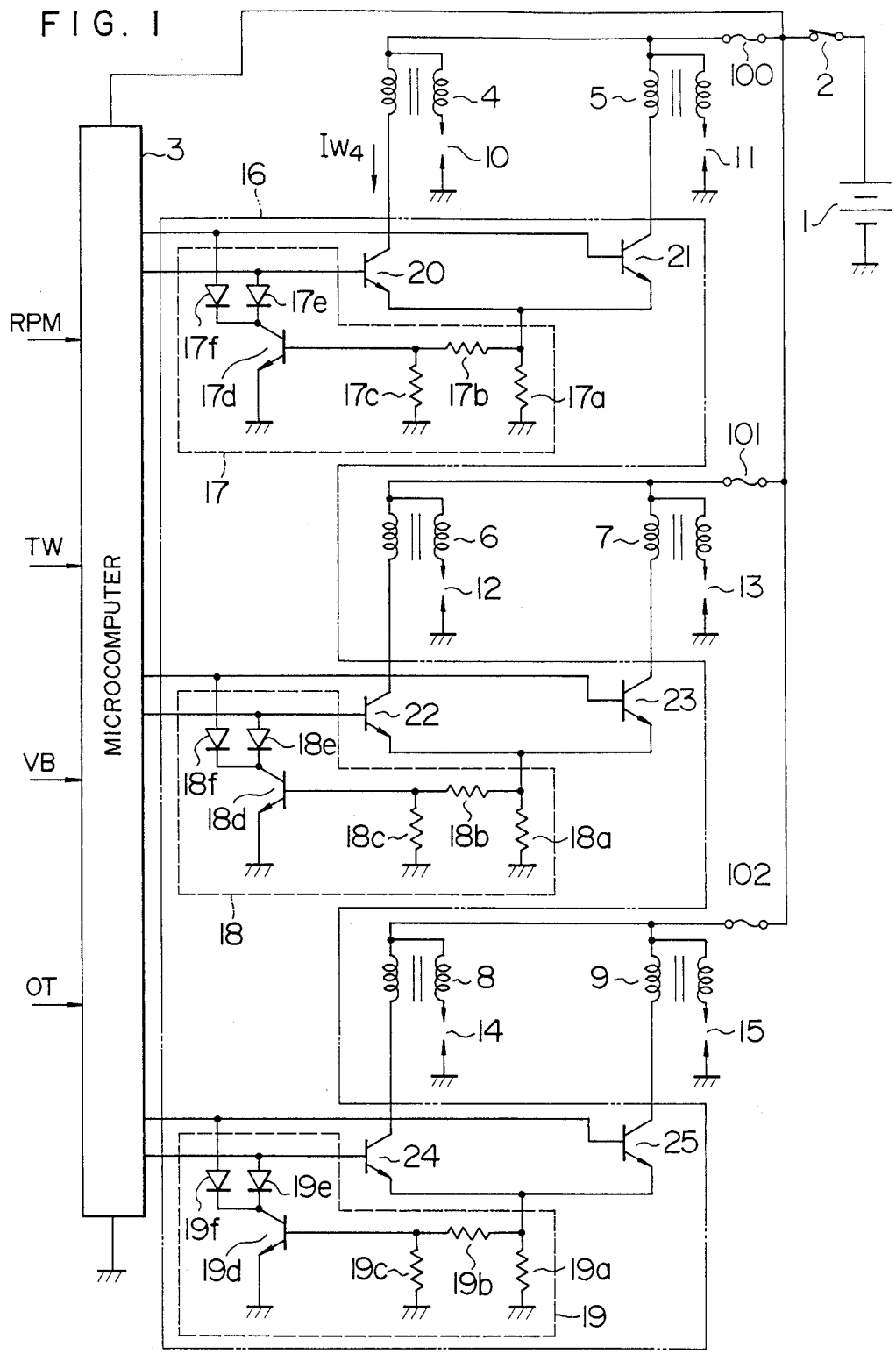
FIG. 1 is a circuit diagram showing an ignition apparatus according to the present invention.

FIG. 1 shows a circuit of an ignition apparatus of electronic distribution type for an in-line 6-cylinder internal combustion engine to which the present invention is applicable. The cylinders of this 6-cylinder engine have ignition plugs 10 to 15 respectively, one for each cylinder, such as an ignition plug 10 for the first cylinder, an ignition plug 11 for the sixth cylinder, an ignition plug 12 for the fifth cylinder, an ignition plug 13 for the second cylinder, an ignition plug 14 for the third cylinder, and an ignition plug 15 for the fourth cylinder for performing the ignition of each cylinder. These cylinders are arranged, for instance, with the first, fifth, third, sixth, second and fourth cylinders in that operating order.

The six ignition plugs 10 to 15 are connected to corresponding ignition coils 4 to 9 respectively, the primary coils of which are connected in series to power transistors 20 to 25. The power transistors 20 to 25 interrupt the primary current of the ignition coils 4 to 9 thereby to generate a high voltage in the secondary coils thereof for starting the ignition plug. In this way, an ignition circuit is made up of the ignition coils 4 to 9 and the power transistors 20 to 25.

This ignition circuit, as seen from the drawings, is divided into three ignition systems each having two ignition circuit units. In the illustrated embodiment, an ignition circuit unit including the ignition coil 4 and the power transistor 20 and an ignition circuit unit including the ignition coil 5 and the power transistor 21 make up a first ignition unit; an ignition circuit unit including the ignition coil 6 and the power transistor 22 and an ignition circuit unit including the ignition coil 7 and the power transistor 23 make up a second ignition unit; and an ignition circuit unit including the ignition coil 8 and the power transistor 24 and an ignition circuit unit including the ignition coil 9 and the power transistor 25 make up a third ignition unit. The first to third ignition units are connected through fuses 100, 101 and 102 respectively and through a key switch 2 to a car battery 1 providing a power supply.

The battery 1, on the other hand, is connected to the power supply terminal of a microcomputer (hereinafter sometimes referred to as "the computer") 3 through the key switch 2. This computer 3 is supplied with output signals from various sensors detecting the operating conditions of the engine including the engine speed (RPM), temperature of cooling water (TW), battery voltage (VB) and the throttle opening degree (OT), and in accordance with these output signals, controls the energization time of the ignition circuit thereby to regulate the ignition timing at an optimum level in accordance with the engine operating conditions. The output of the computer 3 is applied to a power switching module 16 containing the six power transistors 20 to 25. Specifically, the computer 3 applies a control signal to the base terminal of each of the six power transistors 20 to 25 and by doing so, controls the on-off operation of the power transistors 20 to 25.

The power switching module 16 is also divided by the ignition systems so that the power transistor pairs 20, 21; 22, 23; and 24, 25 respectively make up three ignition systems. Each of these ignition units has a common current-limiting circuit. The two power transistors 20, 21 of the first ignition system, for example, share a common current-limiting circuit 17. The current-limiting circuit 17 includes a single current-detecting resistor 17a inserted between the emitters of the power transistors 20, 21 and the earth, dividing resistors 17b, 17c connected in parallel to the current-detecting resistor 17a, a current control transistor 17d with the base thereof connected to a neutral point of the driving resistors and with the emitter thereof grounded, and diodes 17e, 17f connected in forward direction between the collector of the current control transistor 17d and the bases of the two power transistors 20, 21. The two power transistors 22, 23 making up the second ignition system are also provided with a common current-limiting circuit 18, and the other two power transistors 24, 25 making up the third ignition system with a common current-limiting circuit 19. These current-limiting circuits are also incorporated in the power switching module 16.

Figure 2:
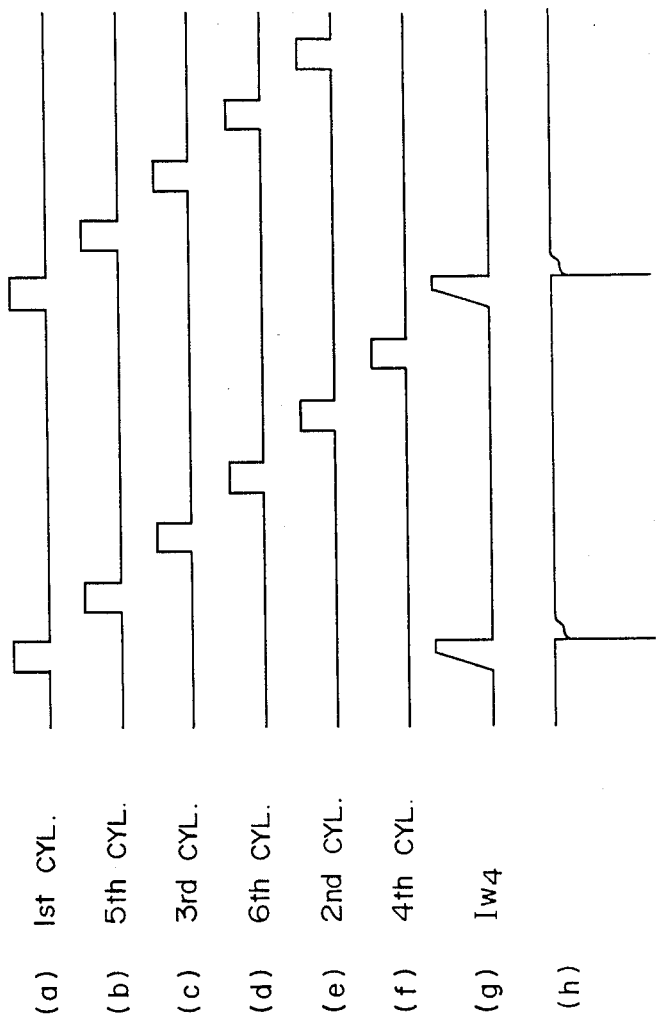
FIG. 2 is a diagram showing waveforms for explaining the operation of the ignition apparatus shown in FIG. 1.

Now, the operation of the ignition apparatus described above will be explained below. The waveforms (a) to (f) in FIG. 2 indicate base signals applied to the power transistors 20 to 25 respectively from the computer 3. More specifically, FIG. 2 (a) shows the base signal of the power transistor 20 for controlling the ignition of the first cylinder, FIG. 2(b) the base signal of the power transistor 22 for the fifth cylinder, FIG. 2(c) the base signal of the power transistor 24 for the third cylinder, FIG. 2(d) the base signal of the power transistor 21 for the sixth cylinder, FIG. 2(e) the base signal of the power transistor 23 for the second cylinder, and FIG. 2(f) the base signal of the power transistor 25 for the fourth cylinder. In this way, the computer 3 produces an ignition control signal (base signal) for each cylinder without overlapping the respective ignition control signals.

The current-limiting circuits 17, 18 and 19 have the same circuit configuration and the same functions, and therefore explanation will be made only about the current-limiting circuit 17 below as an example. The current-detecting resistor 17a of the current-limiting circuit 17 is connected to the emitters of the power transistors 20 and 21 to detect the current flowing therein. Specifically, when a current begins to flow in the current-detecting resistor 17a, a voltage proportional to that current appears across the resistor 17a. This voltage signal is divided by the dividing resistors 17b, 17c and applied to the base of the current-limiting transistor 17d. When the current flowing in the power transistor 20 or 21, that is, the primary current of the ignition coil 4 or 5 reaches a predetermined value, the current-limiting transistor 17d begins to conduct. As a result, the ignition control signal applied to the base of the power transistor 20 or 21 is pulled down to earth through the diode 17e or 17f forwardly connected and also the control transistor 17d turned on as above. In this way, the ignition control signal of the power transistor 20 or 21 is controlled thereby to regulate the maximum value of the primary current of the ignition coil at a predetermined level. The form of the primary current of the ignition coil 4 thus controlled is shown in FIG. 2(g). Further, FIG. 2(h) shows the manner in which a high voltage is generated for starting the ignition plug 10 located in the first cylinder, that is, the secondary voltage of the ignition plug 4. Specifically, at the same time that the primary current of the ignition coil 4 shown in FIG. 4(g) is cut off, a high-voltage ignition signal is generated by the energy thus far stored in the primary coil.

As will be apparent from the embodiment explained above, an ignition apparatus according to the present invention comprises a plurality of ignition circuits each including one ignition coil and one power transistor divided into a plurality of systems, or more specifically, six ignition circuits are divided into three systems and integrated. As a consequence, even in the case where any one of the power transistors is damaged by shorting for some reason, only the system associated with the particular transistor becomes inoperative, while the other systems are capable of normal operation, thereby improving the failsafeness of the ignition apparatus as a whole. In FIG. 1, for example, assume that the power transistor 20 is damaged by shorting for some reason. (Generally, damage to a transistor, if any, occurs in the junction thereof shorting the same.) Current constantly flows in the current detecting resistor 17a, and the current-limiting transistor 17d is kept energized. The base signal applied to the base of the other power transistor 21 in the same system, that is, an ignition control signal is undesirably pulled down to earth by way of the control transistor 17d thus kept energized, so that the power transistor 21 is left cut off. The primary current does not flow in the ignition coil 5, thereby presenting the ignition plug (of the sixth cylinder) from being started.

If the current-limiting circuit described above were shared by all the cylinders (six cylinders, for instance) as in the prior art, the damage by shorting of a power transistor described above would stop the ignition of all the cylinders, thus stopping the engine. In other words, if such a damage by shorting as mentioned above occurs while the car is running, the car will stops moving and will be stalled.

According to the ignition apparatus of the present invention comprising an ignition circuit having ignition coils and power transistors divided and integrated into a plurality of systems each with a current-limiting circuit, by contrast, damage to the power transistor 20 by shorting, if any, will make inoperative the ignition coils 4, 5 acting to start the ignition plugs 10, 11 located in the first and sixth cylinders, while keeping normal operation of the ignition coils 6, 7 acting to start the fifth and second cylinders, the ignition coils 8, 9 acting to start the ignition of the third and fourth cylinders, and the power transistors 22 to 25 for controlling the primary current of the ignition coils. Four out of the six cylinders are thus ignited preventing the engine from being stopped, thereby making it possible to drive to a dealer or the like for appropriate repair.

According to the aforementioned embodiment in which the first cylinder, fifth cylinder, third cylinder, sixth cylinder, second cylinder and the fourth cylinder in the order of ignition, are divided into three systems of two cylinders including pairs of the first and sixth, the fifth and second, and the third and fourth respectively in order to keep the engine running smoothly in well balanced condition, in case of damage by shorting and inoperativeness of the power transistor of one of the systems. In FIG. 1, the ignition systems have fuses 100 to 102 respectively which are adapted to burn out if a power transistor is damaged by shorting. As a result, the ignition system including the power transistor damaged by shorting is separated from the power supply thereby to reduce the power loss, that is, battery loss.

Figure 3:
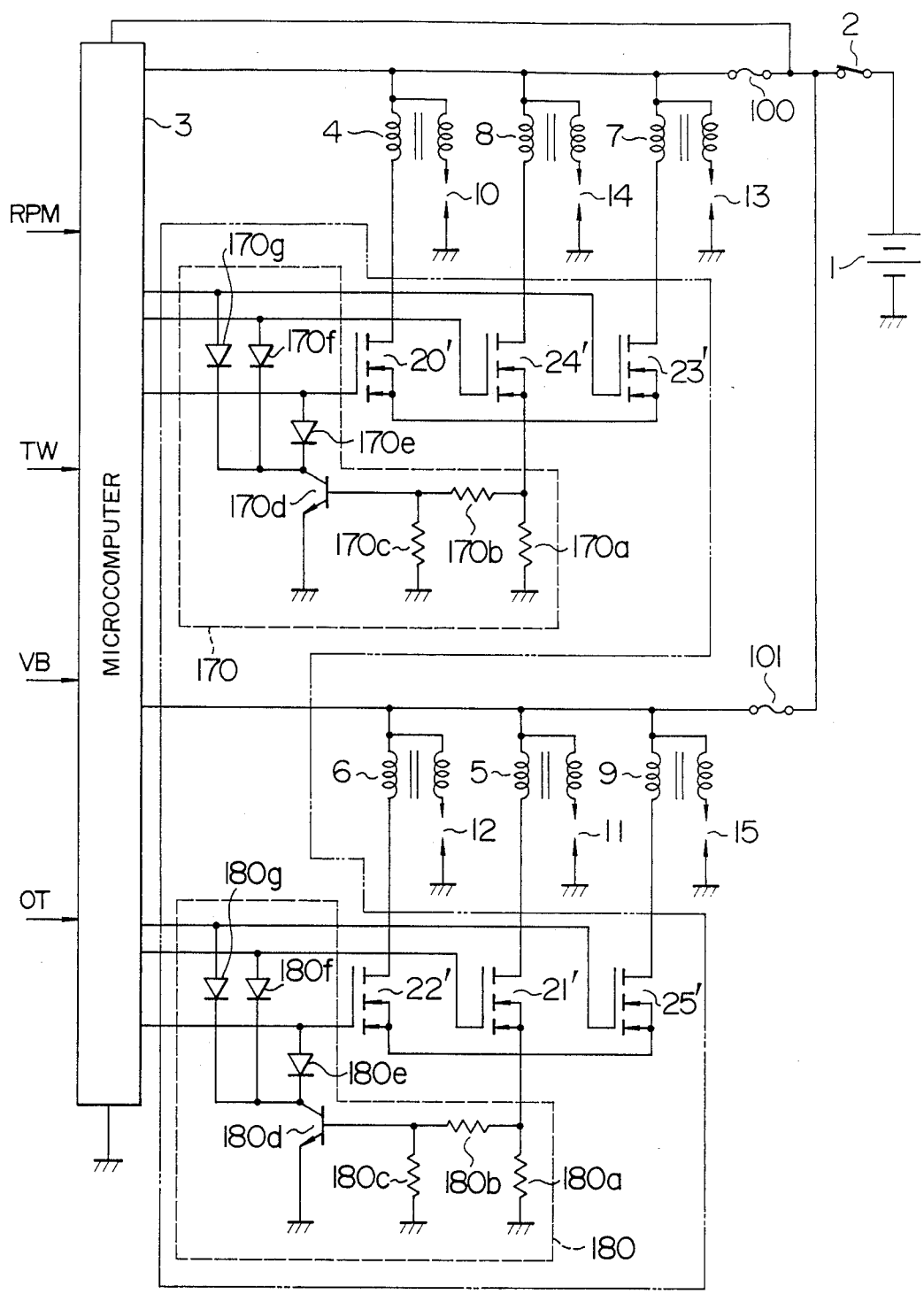
FIG. 3 is a circuit diagram showing another embodiment of the ignition apparatus according to the present invention.

FIG. 3 shows another embodiment of the present invention. As is obvious from the drawing, an ignition circuit for a 6-cylinder engine is divided into two systems using power MOS FETs 20' to 25' as power switching devices. Specifically, a first ignition system includes ignition coils 4, 8 and 7 for igniting the ignition plug 10 for the first cylinder, the ignition plug 14 for the third cylinder and the ignition plug 13 for the second cylinder, and power MOS FETs 20', 24' and 23'. The other system is made up of ignition coils 6, 5 and 9 for starting the ignition plug 12 for the fifth cylinder, the ignition plug 11 for the sixth cylinder and the ignition plug 15 for the fourth cylinder respectively and power MOS FETs 22', 21' and 25' connected to them in series. In this configuration, the first, fifth, third, sixth, second and fourth cylinders are ignited in that order as in the first embodiment shown in FIG. 1. As is apparent from this configuration, according to this embodiment, the ignition circuits of the first and second systems are sequentially distributed in the order of ignition so that even if one system becomes faulty due to the power MOS FET being damaged by shorting, the other systems (three cylinders) remain in normal operation, thus enabling the engine to be driven smoothly in balanced condition.

The current-limiting circuits 170 and 180 included in the ignition systems have substantially the same function as those in FIG. 1. The current-limiting circuit 170, for instance, includes a current-detecting resistor 170a, dividing resistors 170b, 170c, a voltage control transistor 170d, and three forwardly-connected diodes 170e, 170f and 170g connected to the sources of three power MOS FETs 20', 24' and 23'.

A power MOS FET is inherently a voltage control device, the drain (source) current of which is controllable by applying a constant voltage to the gate thereof. In the current region of 4 to 6 A used for an ignition system, however, the gate voltage is difficult to control on the one hand, and an unstable peak value of the drain (source) current is caused by variations in power MOS FET on the other. Specifically, the control of the peak value of the drain (source) by control of the gate voltage has a certain limitation. For this reason, the embodiment of FIG. 3 uses a transistor 170d or 180d and the gate voltage is controlled by use of $V_{CE(sat)}$ of the transistor 170d. When the source current of a power MOS FET (such as 20') reaches a predetermined value, the transistor 170d conducts and controls the gate voltage in such a manner as to keep the source current constant. As a result, the control accuracy of the current limit value is greatly improved as compared with the conventional method of constant gate voltage control. The other parts of the circuit shown in FIG. 3 are identical to those in FIG. 1.

In the embodiment of FIG. 3, even if one of the power switching devices is shorted and damaged, the other ignition systems continue to keep the engine running. Unlike in the embodiment of FIG. 1 where the engine output is reduced to two thirds, however, the engine output becomes one half in the embodiment under consideration. This is due to the fact that the ignition is divided into two instead of three systems. In spite of this shortcoming, the embodiment shown in FIG. 3 has the advantage of high economy and low cost as it includes only two current-limiting circuits and fuses.

Figure 4:
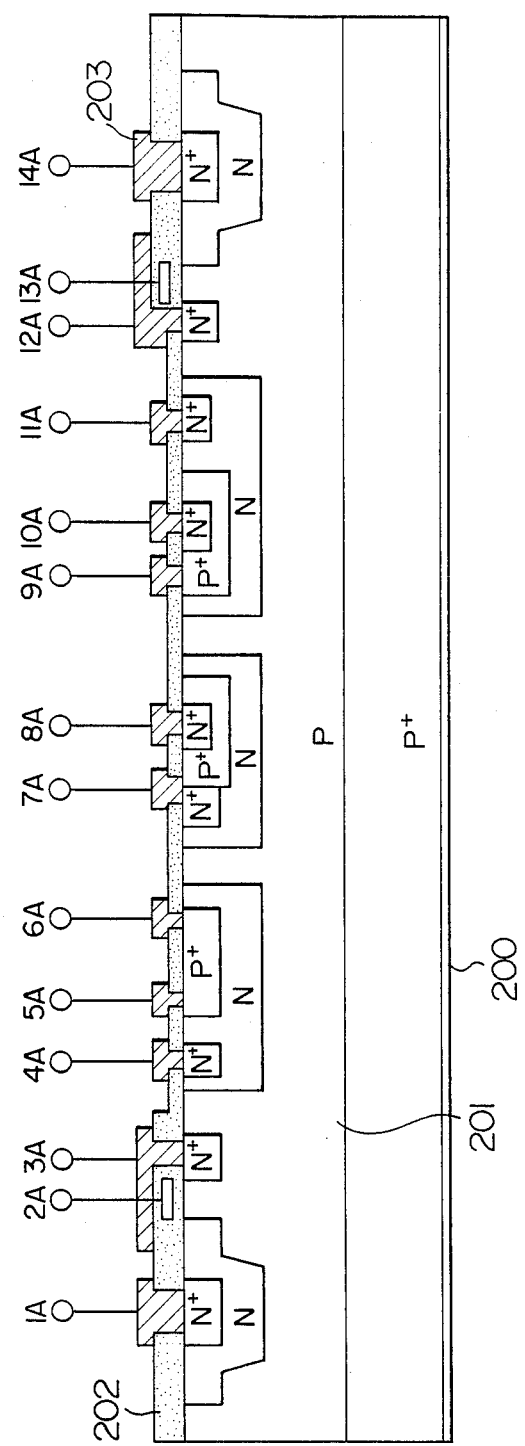
FIG. 4 is a partly cut-away sectional view showing the construction of a power module of the ignition apparatus shown in FIG. 3.

FIG. 4 shows a configuration of the MOS FET and the power switching device constructed on a single silicon chip. In the sectional view of FIG. 4, devices are formed on a P-type substrate. Numeral 200 designates a metallized layer adapted to be soldered to a heat sink not shown. Numeral 201 designates a P-type layer connected to the most negative potential (earth). Numeral 202 designates an insulating layer made of silicon oxide. The hatched part designated by numeral 203 is an aluminum electrode which is formed by evaporation. The electrodes 1A, 2A and 3A are connected to a power MOS FET, electrode 1A being connected to a drain, electrode 2A being connected to a gate and electrode 3A being connected to a source. The electrodes 12A, 13A and 14A are also connected to a power MOS FET, electrode 12A being connected to a source, electrode 13A to a gate and electrode 14A to a drain. The electrodes 4A, 5A and 6A are connected to elements which make up a resistor. A diffusion resistor is obtained in the P+ layer between the elements connected to electrodes 5A and 6A by connecting the electrode 4A to the most positively potential (positive voltage of the battery). The parts connected to electrodes 7A and 8A, on the other hand, indicate a diode having a PN junction, and electrodes 9A, 10A and 11A are connected to elements which form a current limiting transistor. Electrode 9A is connected to a base, electrode 10A to an emitter and electrode 11A to a collector. A plurality of power MOS FETs are formed on a single silicon chip in this way, and further by use of the N-type and P-type layers of silicon, the current-limiting circuits may be constructed on a single chip. As a result, the devices are capable of being connected collectively by means of aluminum vapor deposition between contacts, thus improving the connector reliability greatly as compared with the conventional method using soldering and wire bonding. Also, it is possible to reduce the number of parts, so that the power switch is reduced in size, thereby providing an inexpensive ignition system with high mountability and shortened process time.

The power switching devices may be configured of power transistors in place of the power MOS FETs. A power switch constructed in the manner shown in FIG. 4 is applicable not only to the circuit of FIG. 1 but also to an electronic distribution and ignition system of simultaneous ignition type shown in FIG. 3. The reliability of the connectors is thus improved while at the same time reducing the size of the power switching devices.

In the above-mentioned embodiments, each ignition system including a plurality of power switches and a current-limiting circuit are formed on a single semiconductor substrate. In the embodiment shown in FIG. 1, for instance, the power transistors 20, 21 and the current-limiting circuit 17 are formed as one system on a single semiconductor substrate, the power transistors 22, 23 and the current-limiting circuit 18 as another system on another semiconductor substrate, and the power transistors 24, 25 and the current-limiting circuit 19 as still another system on still another semiconductor substrate thereby to make up a power switching module 16. Specifically, each of three semiconductor substrates has two power switching devices and a current-limiting circuit formed thereon, and three assemblies thereof are used to control the ignition of a 6-cylinder engine.

In the embodiment of FIG. 3, on the other hand, three power MOS FETs and one current-limiting circuit make up each ignition system, and two semiconductor substrates are used to configure a power switching module.

As explained above, different ignition systems are formed on different semiconductor substrates in order to make sure that even when the power switching device of a given ignition system is damaged by shorting, the other systems are kept intact thereby securing safety and accurate igniting operation of the other ignition systems. In the case where one ignition system is configured of two power transistors and one current-limiting circuit as in the embodiment of FIG. 1, the use of two such assemblies finds an easy application in a four-cylinder engine, and the use of four such assemblies in an eight-cylinder engine. The ignition circuit according to the embodiment shown in FIG. 3 may be provided only with one current-limiting circuit for each three power switching devices, thus leading to the advantage of a low-cost configuration. If MOS FETs are used as the power transistors constructed on the semiconductor substrates, in particular, comparatively small power is consumed with an increased integrity, thereby making the circuit suitable for a compact ignition system.

Figure 5:
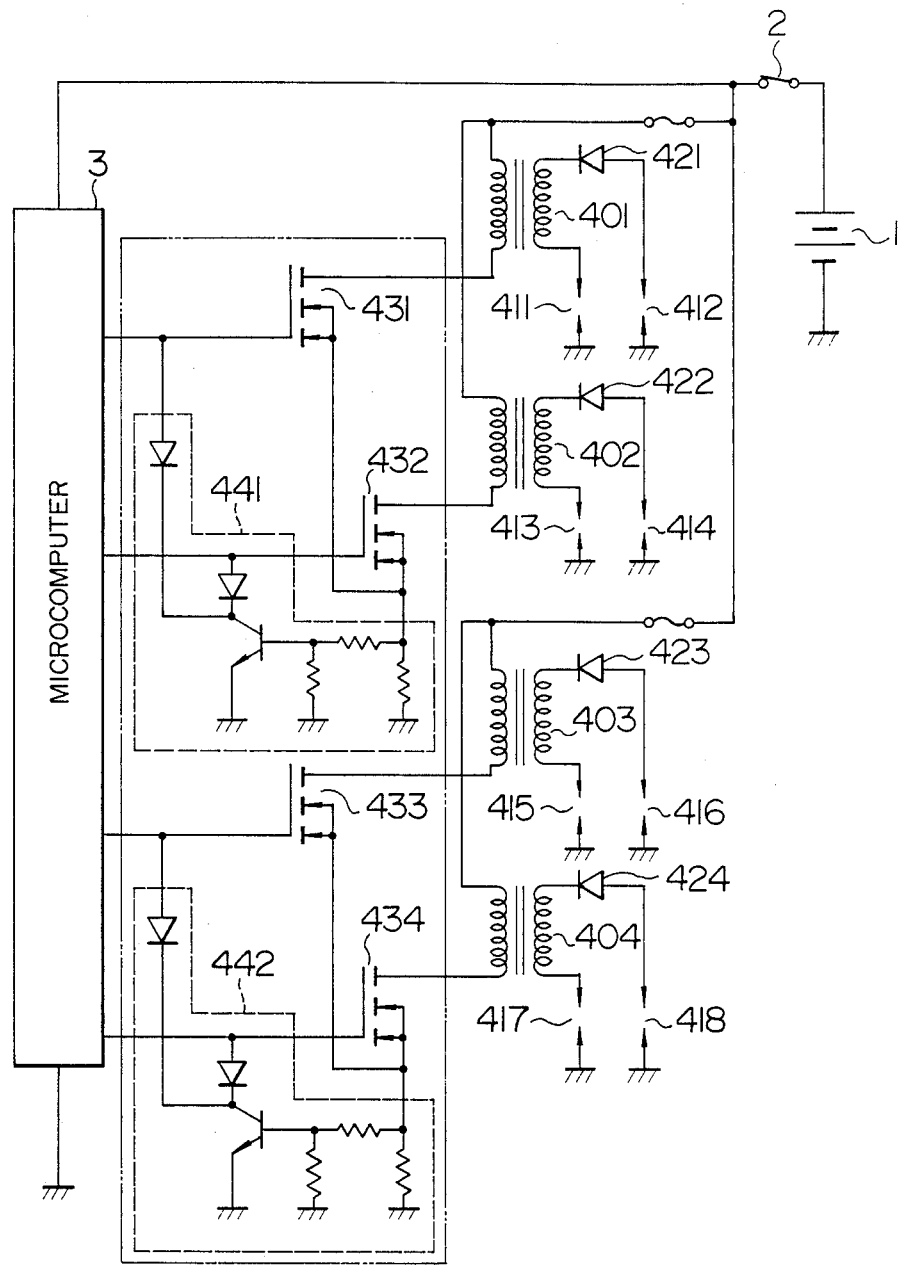
FIG. 5 is a circuit diagram showing still another embodiment of the present invention.

Still another embodiment of the invention applied to an ignition system of simultaneous ignition type for an eight-cylinder engine is shown in FIG. 5. In FIG. 5, those component parts designated by the same reference numerals as those in FIG. 1 denote the same component parts respectively as in FIG. 1. In this embodiment, the secondary coils of the ignition coils 401, 402, 403, 404 are connected with ignition plugs 411, 412, 413, 414, 415, 416, 417, 418, and the secondary coil 404 of an eight-cylinder engine has ignition plugs 411, 412, 413, 414, 415, 416, 417, 418 connected thereacross, which are distributed among the cylinders of the eight-cylinder engine. Also, high-voltage diodes 421, 422, 423, 424 are inserted between one of the output terminals of the secondary coil and the ignition plugs 412, 414, 416, 418. The primary coils of the ignition coils 401, 402, 403, 404 are connected in series with power MOS FETs 431, 432, 433, 434 respectively, the gates of which are supplied with a control signal from a microcomputer 3. By turning on and off the power MOS FETs, a high voltage is generated across the secondary coil of the ignition coils 401, 402, 403, 404 for starting a spark in the ignition plugs. In this embodiment, two ignition plugs connected to the same ignition coil such as ignition plugs 411, 412 connected with the secondary of the ignition coil 401, start a spark at the same time. Also, a spark discharge is effected in the explosion stroke and exhaust stroke of the engine.

The above-mentioned power MOS FETs 431 and 432 make up one ignition system and share a current-limiting circuit 441. Also, the power MOS FETs 433, 434 make up another system including a similar current-limiting circuit 442. These current-limiting circuits 441, 442 are similar to those shown in FIG. 3. Also in this ignition system, even if one of the power MOS FETs of the two systems is damaged by shorting, the remaining parts of the system continue to function, with the result that the engine continues to be positively driven even though the engine output is reduced to one half.

It will thus be understood from the foregoing description that according to the present invention, a failure by damage of a given power switching device by shorting does not make the ignition apparatus inoperative as a whole, thereby providing an ignition apparatus of electronic distribution type for a multi-cylinder internal combustion engine superior in failsafe performance.

We claim:

1. An ignition apparatus of electronic distribution type for use with a multi-cylinder engine, said apparatus comprising:
   a plurality of spark generators, each provided in a respective cylinder of the engine;
   a plurality of ignition circuits each provided for no more than two of the cylinders of the engine and each including an ignition coil and a power switching element connected to the spark generator of an associated cylinder, said ignition circuits being divided into a plurality of groups, each group including at least two ignition circuits; and
   a plurality of current-limiting circuits each connected to a respective one of said groups of ignition circuits, each current-limiting circuit being connected in common to the power switching elements of the associated group of ignition circuits for controlling currents flowing through the power switching elements of those ignition circuits, so that if a power switching element of an ignition circuit in one group malfunctions, the current-limiting circuit of said one group will not affect the operation of power switching elements in the other groups of ignition circuits.

2. An ignition apparatus according to claim 1, wherein the power switching elements and elements of the associated current-limiting circuit are formed on a common semiconductor substrate.

3. An ignition apparatus according to claim 2, wherein said power switching elements are MOS FETs.

4. An ignition apparatus according to claim 1, wherein each of said groups of ignition circuits includes two power switching elements.

5. An ignition apparatus according to claim 1, wherein each of said groups of ignition circuits includes three power switching elements.

* * * * *